(12) United States Patent
Im et al.

(10) Patent No.: US 7,679,028 B2
(45) Date of Patent: *Mar. 16, 2010

(54) METHODS FOR PRODUCING UNIFORM LARGE-GRAINED AND GRAIN BOUNDARY LOCATION MANIPULATED POLYCRYSTALLINE THIN FILM SEMICONDUCTORS USING SEQUENTIAL LATERAL SOLIDIFICATION

(75) Inventors: James S. Im, New York, NY (US); Robert S. Sposili, New York, NY (US); Mark A. Crowder, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 87 days.

This patent is subject to a terminal disclaimer.

(21) Appl. No.: 11/744,493

(22) Filed: May 4, 2007

(65) Prior Publication Data

US 2007/0202668 A1 Aug. 30, 2007

Related U.S. Application Data

(60) Division of application No. 11/141,815, filed on Jun. 1, 2005, now Pat. No. 7,319,056, which is a continuation of application No. 10/294,001, filed on Nov. 13, 2002, now Pat. No. 7,029,996, which is a continuation of application No. 09/390,535, filed on Sep. 3, 1999, now Pat. No. 6,555,449, application No. 11/744,493, which is a continuation-in-part of application No. 09/200,533, filed on Nov. 27, 1998, now Pat. No. 6,322,625, and a continuation-in-part of application No. PCT/US96/07730, filed on May 28, 1996.

(51) Int. Cl.
*B23K 26/00* (2006.01)
*B23K 26/06* (2006.01)

(52) U.S. Cl. ............................. 219/121.6; 219/121.73
(58) Field of Classification Search .. 219/121.6–121.86
See application file for complete search history.

(56) References Cited

U.S. PATENT DOCUMENTS 3,632,205 A  1/1972  Marcy (Continued)

FOREIGN PATENT DOCUMENTS

DE  19839718  3/2000

(Continued)

OTHER PUBLICATIONS

U.S. Appl. No. 60/253,256, filed Aug. 31, 2003, Im.

(Continued)

*Primary Examiner*—Sang Y Paik
(74) *Attorney, Agent, or Firm*—Baker Botts LLP

(57) ABSTRACT

Methods for processing an amorphous silicon thin film sample into a polycrystalline silicon thin film are disclosed. In one preferred arrangement, a method includes the steps of generating a sequence of excimer laser pulses, controllably modulating each excimer laser pulse in the sequence to a predetermined fluence, homoginizing each modulated laser pulse in the sequence in a predetermined plane, masking portions of each homoginized fluence controlled laser pulse in the sequence with a two dimensional pattern of slits to generate a sequence of fluence controlled pulses of line patterned beamlets, each slit in the pattern of slits being sufficiently narrow to prevent inducement of significant nucleation in region of a silicon thin film sample irradiated by a beamlet corresponding to the slit, irradiating an amorphous silicon thin film sample with the sequence of fluence controlled slit patterned beamlets to effect melting of portions thereof corresponding to each fluence controlled patterned beamlet pulse in the sequence of pulses of patterned beamlets, and controllably sequentially translating a relative position of the sample with respect to each of the fluence controlled pulse of slit patterned beamlets to thereby process the amorphous silicon thin film sample into a single or polycrystalline silicon thin film.

6 Claims, 5 Drawing Sheets

U.S. PATENT DOCUMENTS

| | | |
|---|---|---|
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |
| 4,514,895 A | 5/1985 | Nishimura |
| 4,639,277 A | 1/1987 | Hawkins |
| 4,691,983 A | 9/1987 | Kobayashi et al. |
| 4,727,047 A | 2/1988 | Bolzer et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Russell et al. |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,186 B1 | 12/2001 | Park et al. |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,535,535 B1 | 3/2003 | Yamazaki et al. |
| 6,555,449 B1 | 4/2003 | Im et al. |
| 6,562,701 B2 | 5/2003 | Ishida et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,767,804 B2 | 7/2004 | Crowder |
| 6,770,545 B2 | 8/2004 | Yang |
| 6,784,455 B2 | 8/2004 | Maekawa et al. |
| 6,830,993 B1 | 12/2004 | Im et al. |
| 6,858,477 B2 | 2/2005 | Deane et al. |

| | | | |
|---|---|---|---|
| 6,908,835 B2 | 6/2005 | Sposili et al. |
| 6,961,117 B2 | 11/2005 | Im |
| 7,091,411 B2 | 8/2006 | Falk et al. |
| 7,187,016 B2 | 3/2007 | Arima |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,311,778 B2 | 12/2007 | Im et al. |
| 7,341,928 B2 | 3/2008 | Im |
| 2001/0001745 A1 | 5/2001 | Im et al. |
| 2001/0041426 A1 | 11/2001 | Im |
| 2002/0083557 A1 | 7/2002 | Jung |
| 2002/0096680 A1 | 7/2002 | Sugano et al. |
| 2002/0104750 A1 | 8/2002 | Ito |
| 2002/0119609 A1 | 8/2002 | Hatano et al. |
| 2002/0151115 A1 | 10/2002 | Nakajima et al. |
| 2003/0000455 A1 | 1/2003 | Voutsas |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0029212 A1 | 2/2003 | Im |
| 2003/0068836 A1 | 4/2003 | Hongo et al. |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0194613 A1 | 10/2003 | Voutsas et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1 | 2/2005 | Im et al. |
| 2005/0059265 A1 | 3/2005 | Im |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2006/0030164 A1 | 2/2006 | Im |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0020942 A1 | 1/2007 | Im |
| 2007/0032096 A1 | 2/2007 | Im |
| 2007/0108472 A1 | 5/2007 | Jeong et al. |
| 2007/0111349 A1 | 5/2007 | Im |
| 2007/0215942 A1 | 9/2007 | Chen et al. |

FOREIGN PATENT DOCUMENTS

| | | |
|---|---|---|
| DE | 10103670 | 8/2002 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 4279064 | 10/1992 |
| JP | 6252048 | 9/1994 |
| JP | 6283422 | 10/1994 |
| JP | 7176757 | 7/1995 |
| JP | 11064883 | 3/1999 |
| JP | 11281997 | 10/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO01071791 | 9/2001 |
| WO | 02031869 | 4/2002 |
| WO | 0242847 | 5/2002 |
| WO | 02086954 | 5/2002 |
| WO | 02086955 | 10/2002 |
| WO | 03018882 | 3/2003 |
| WO | 03046965 | 6/2003 |
| WO | 04075263 | 8/2003 |
| WO | 03084688 | 10/2003 |
| WO | 04017379 | 2/2004 |
| WO | 04017380 | 2/2004 |
| WO | 04017381 | 2/2004 |
| WO | 04017382 | 2/2004 |
| WO | WO05029550 | 3/2005 |
| WO | WO05029551 | 3/2005 |
| WO | WO2005029546 | 3/2005 |
| WO | WO2005029548 | 3/2005 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).

Crowder et al., "Low-Temperature Single-Crystal Si TFT's Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH. 1999.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliabity," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of A1-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part I—Regular Papers Short Notes & Review Papers, pp. 4491-98 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-62 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". 1999.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No Month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No Month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, Journal of Applied Physics, "Polycrystalline silicon thin films processed with silicon ion implantation and subsequent solid-phase crystallization: Theory, experiments, and thin-film transistor applications" —Apr. 1, 1994—vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorphous Silicon Thin Films", Ph. D. Dissertation Abstract, Columbia University, 1996.

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, Laser Processing of Thin Films and Microstructures, Oxidation, Deposition, and Etching of Insulators (Springer-Verlag Berlin Heidelber 1987).

Brotherton, S.D., et al., Characterisation of poly-Si TFTs in Directionally Solidified SLS Si, Asia Display/IDS'01, p. 387-390.

Crowder et al., "Parametric investigation of SLS-processed poly-silicon thin films for TFT application," Preparations and Characterization, Elsevier, Sequoia, NL, vol. 427, No. 1-2, 3 Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N. A. Economou, Effect of pressure on the growth of crystallites of low-pressure chemical-vapordeposited polycrystalline silicon films and the effective electron mobility under high normal field in thin-film transistors, J. Appl. Phys. 73, 8402 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Reige et al., "Microstructural Evolution Induced by Scanned Laser Annealing in Al Interconnects," Appl. Phys. Lett., vol. 75, No. 10, p. 1464-1466, 1999.

Hawkins, W.G. et al., "Origin of lamellae in radiatively melted silicon films," appl. Phys. Lett. 42(4), Feb. 15, 1983.

Hayzelden, C. And J.L. Batstone, Silicide formation and silicide-mediated crystallization of nickel-implanted amorphous silicon thin films, J. Appl. Phys. 73, 8279 (1993).

IM, J.S., Method and system for producing crystalline thin films with a uniform crystalline orientation, U.S. Appl. No. 60/503419; ref file # 36013(BB); Columbia ref. M02-063.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals", OE Magazine, Nov. 2001, 33-35.

Kim, C. et al., Development of SLS-Based SOG Display, IDMC 2005, Thu-15-02, 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), 15 Jan. 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. And S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Super-thin Si Films for High-Performance Thin Film Transistor Devices, Perspectives, Science, and Technologies for Novel Silicon on.

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

Van Der Wilt, P.C., "Textured poly-Si films for hybrid SLS," Jul. 2004, pp. 1-5.

Van Der Wilt, P.C., "State-of-the-Art Laser Crystallization of Si for Flat Panel Displays," PhAST, May 18, 2004, pp. 1-34.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

van der Wilt, "The Commercialization of the SLS Technology," Taiwan FPD, Jun. 11, 2004, pp. 1-12.

METHODS FOR PRODUCING UNIFORM LARGE-GRAINED AND GRAIN BOUNDARY LOCATION MANIPULATED POLYCRYSTALLINE THIN FILM SEMICONDUCTORS USING SEQUENTIAL LATERAL SOLIDIFICATION

CROSS REFERENCE TO RELATED APPLICATIONS

This application is a divisional of U.S. application Ser. No. 11/141,815, filed Jun. 1, 2005, now U.S. Pat. No. 7,319,056 which is a continuation of U.S. application Ser. No. 10/294,001, filed Nov. 13, 2002, now U.S. Pat. No. 7,029,996 which is a continuation of U.S. application Ser. No. 09/390,535, filed Sep. 3, 1999, which has issued as U.S. Pat. No. 6,555,449. This application is also a continuation-in-part of International Application PCT/US96/07730, filed May 28, 1996, and U.S patent application Ser. No. 09/200,533, filed Nov. 27, 1998, which has issued as U.S. Pat. No. 6,322,625. The entire disclosures of the aforementioned priority applications are herein incorporated by reference in their entireties.

NOTICE OF GOVERNMENT RIGHTS

The U.S. Government has certain rights in this invention pursuant to the terms of the Defense Advanced Research Project Agency award number N66001-98-1-8913.

BACKGROUND OF THE INVENTION

I. Field of the Invention

The present invention relates to techniques for semiconductor processing, and more particularly to semiconductor processing which may be performed at low temperatures.

II. Description of the Related Art

In the field of semiconductor processing, there have been several attempts to use lasers to convert thin amorphous silicon films into polycrystalline films. For example, in James Im et al., "Crystalline Si Films for Integrated Active-Matrix Liquid-Crystal Displays," 11 MRS Bullitin 39 (1996), an overview of conventional excimer laser annealing technology is presented. In such a system, an excimer laser beam is shaped into a long beam which is typically up to 30 cm long and 500 micrometers or greater in width. The shaped beam is scanned over a sample of amorphous silicon to facilitate melting thereof and the formation of polycrystalline silicon upon resolidification of the sample.

The use of conventional excimer laser annealing technology to generate polycrystalline silicon is problematic for several reasons. First, the polycrystalline silicon generated in the process is typically small grained, of a random microstructure, and having a nonuniform grain sizes, therefore resulting in poor and nonuniform devices and accordingly, low manufacturing yield. Second, in order to obtain acceptable performance levels, the manufacturing throughput for producing polycrystalline silicon must be kept low. Also, the process generally requires a controlled atmosphere and preheating of the amorphous silicon sample, which leads to a reduction in throughput rates. Accordingly, there exists a need in the field to generate higher quality polycrystalline silicon at greater throughput rates. There likewise exists a need for manufacturing techniques which generate larger and more uniformly microstructured polycrystalline silicon thin films to be used in the fabrication of higher quality devices, such as flat panel displays.

SUMMARY OF THE INVENTION

An object of the present invention is to provide techniques for producing uniform large-grained and grain boundary location controlled polycrystalline thin film semiconductors using the sequential lateral solidification process.

A further object of the present invention is to form large-grained and grain boundary location manipulated polycrystalline silicon over substantially the entire semiconductor sample.

Yet another object of the present invention is to provide techniques for the fabrication of semiconductors devices useful for fabricating displays and other products where the predominant orientation of the semiconductor grain boundaries may be controllably aligned or misaligned with respect to the current flow direction of the device.

In order to achieve these objectives as well as others that will become apparent with reference to the following specification, the present invention provides methods for processing an amorphous silicon thin film sample into a polycrystalline silicon thin film are disclosed. In one preferred arrangement, a method includes the steps of generating a sequence of excimer laser pulses, controllably modulating each excimer laser pulse in the sequence to a predetermined fluence, homoginizing each modulated laser pulse in the sequence in a predetermined plane, masking portions of each homoginized fluence controlled laser pulse in the sequence with a two dimensional pattern of slits to generate a sequence of fluence controlled pulses of line patterned beamlets, each slit in the pattern of slits being sufficiently narrow to prevent inducement of significant nucleation in region of a silicon thin film sample irradiated by a beamlet corresponding to the slit, irradiating an amorphous silicon thin film sample with the sequence of fluence controlled slit patterned beamlets to effect melting of portions thereof corresponding to each fluence controlled patterned beamlet pulse in the sequence of pulses of patterned beamlets, and controllably sequentially translating a relative position of the sample with respect to each of the fluence controlled pulse of slit patterned beamlets to thereby process the amorphous silicon thin film sample into a single or polycrystalline silicon thin film.

In a preferred arrangement, the masking step includes masking portions of each homoginized fluence controlled laser pulse in said sequence with a two dimensional pattern of substantially parallel straight slits spaced a predetermined distance apart and linearly extending parallel to one direction of said plane of homoginization to generate a sequence of fluence controlled pulses of slit patterned beamlets. Advantageously, the translating provides for controllably sequentially translating the relative position of the sample in a direction perpendicular to each of the fluence controlled pulse of slit patterned beamlets over substantially the predetermined slit spacing distance, to the to thereby process the amorphous silicon thin film sample into polycrystalline silicon thin film having long grained, directionally controlled crystals.

In an especially preferred arrangement, the masking step comprises masking portions of each homoginized fluence controlled laser pulse in the sequence with a two dimensional pattern of substantially parallel straight slits of a predetermined width, spaced a predetermined distance being less than the predetermined width apart, and linearly extending parallel to one direction of the plane of homoginization to generate a sequence of fluence controlled pulses of slit patterned beamlets. In this arrangement, translating step comprises translating by a distance less than the predetermined width the relative position of the sample in a direction perpendicular to each of the fluence controlled pulse of slit patterned beamlets, to the to thereby process the amorphous silicon thin film sample into polycrystalline silicon thin film having long grained, directionally controlled crystals using just two laser pulses. In one exemplary embodiment, the predetermined width is approximately 4 micrometers, the predetermined spacing distance is approximately 2 micrometers, and the translating distance is approximately 3 micrometers.

In an alternative preferred arrangement, the masking step comprises masking portions of each homoginized fluence controlled laser pulse in the sequence with a two dimensional pattern of substantially parallel straight slits spaced a predetermined distance apart and linearly extending at substantially 45 degree angle with respect to one direction of the plane of homoginization to generate a sequence of fluence controlled pulses of slit patterned beamlets. In this arrangement, the translating step provides for controllably sequentially translating the relative position of the sample in a direction parallel to the one direction of the plane of homoginization over substantially the predetermined slit distance, to thereby process the amorphous silicon thin film sample into polycrystalline silicon thin film having long grained, directionally controlled crystals that are disoriented with respect to the XY axis of the thin silicon film.

In yet another preferred arrangement, the masking step comprises masking portions of each homoginized fluence controlled laser pulse in the sequence with a two dimensional pattern of intersecting straight slits, a first group of straight slits being spaced a first predetermined apart and linearly extending at substantially 45 degree angle with respect to a first direction of the plane of homoginization, and a second group of straight slits being spaced a second predetermined distance apart and linearly extending at substantially 45 degree angle with respect to a second direction of the plane of homoginization and intersecting the first group at substantially a 90 degree angle, to generate a sequence of fluence controlled pulses of slit patterned beamlets. The corresponding translating step provides for controllably sequentially translating the relative position of the sample in a direction parallel to the first direction of the plane of homoginization over substantially the first predetermined slit spacing distance, to thereby process the amorphous silicon thin film sample into polycrystalline silicon thin film having large diamond shaped crystals.

In still another alternative arrangement, the masking step comprises masking portions of each homoginized fluence controlled laser pulse in the sequence with a two dimensional pattern of sawtooth shaped slits spaced a predetermined distance apart and extending generally parallel to one direction of the plane of homoginization to generate a sequence of fluence controlled pulses of slit patterned beamlets. In this arrangement, the translating step provides for controllably sequentially translating the relative position of the sample in a direction perpendicular to each of the fluence controlled pulse of slit patterned beamlets over substantially the predetermined slit spacing distance, to the to thereby process the amorphous silicon thin film sample into polycrystalline silicon thin film having large hexagonal crystals.

In a modified arrangement, an alternative technique for processing an amorphous silicon thin film sample into a polycrystalline silicon thin film using a polka-dot pattern is provided. Te technique includes generating a sequence of excimer laser pulses, homoginizing each laser pulse in the sequence in a predetermined plane, masking portions of each homoginized laser pulse in the sequence with a two dimensional pattern of substantially opaque dots to generate a sequence of pulses of dot patterned beamlets, irradiating an amorphous silicon thin film sample with the sequence of dot patterned beamlets to effect melting of portions thereof corresponding to each dot patterned beamlet pulse in the sequence of pulses of patterned beamlets, and controllably sequentially translating the sample relative to each of the pulses of dot patterned beamlets by alternating a translation direction in two perpendicular axis and in a distance less than the super lateral grown distance for the sample, to thereby process the amorphous silicon thin film sample into a polycrystalline silicon thin film.

The accompanying drawings, which are incorporated and constitute part of this disclosure, illustrate a preferred embodiment of the invention and serve to explain the principles of the invention.

BRIEF DESCRIPTION OF THE DRAWINGS

FIG. 9b is an instructive diagram illustrating mask translation using the mask of FIG. 9a;

DESCRIPTION OF PREFERRED EMBODIMENTS

The present invention provides techniques for producing uniform large-grained and grain boundary location controlled polycrystalline thin film semiconductors using the sequential lateral solidification process. In order to fully understand those techniques, the sequential lateral solidification process must first be appreciated.

The sequential lateral solidification process is a technique for producing large grained silicon structures through small-scale unidirectional translation of a silicon sample in between sequential pulses emitted by an excimer laser. As each pulse is absorbed by the sample, a small area of the sample is caused to melt completely and resolidify laterally into a crystal region produced by the preceding pulses of a pulse set.

A particularly advantageous sequential lateral solidification process and an apparatus to carry out that process are disclosed in our co-pending patent application entitled "Systems and Methods using Sequential Lateral Solidification for Producing Single or Polycrystalline Silicon Thin Films at Low Temperatures," filed concurrently with the present application and assigned to the common assignee, the disclosure of which is incorporated by reference herein. While the foregoing disclosure is made with reference to the particular techniques described in our co-pending patent application, it should be understood that other sequential lateral solidification techniques could readily be adapted for use in the present invention.

Figure 1:
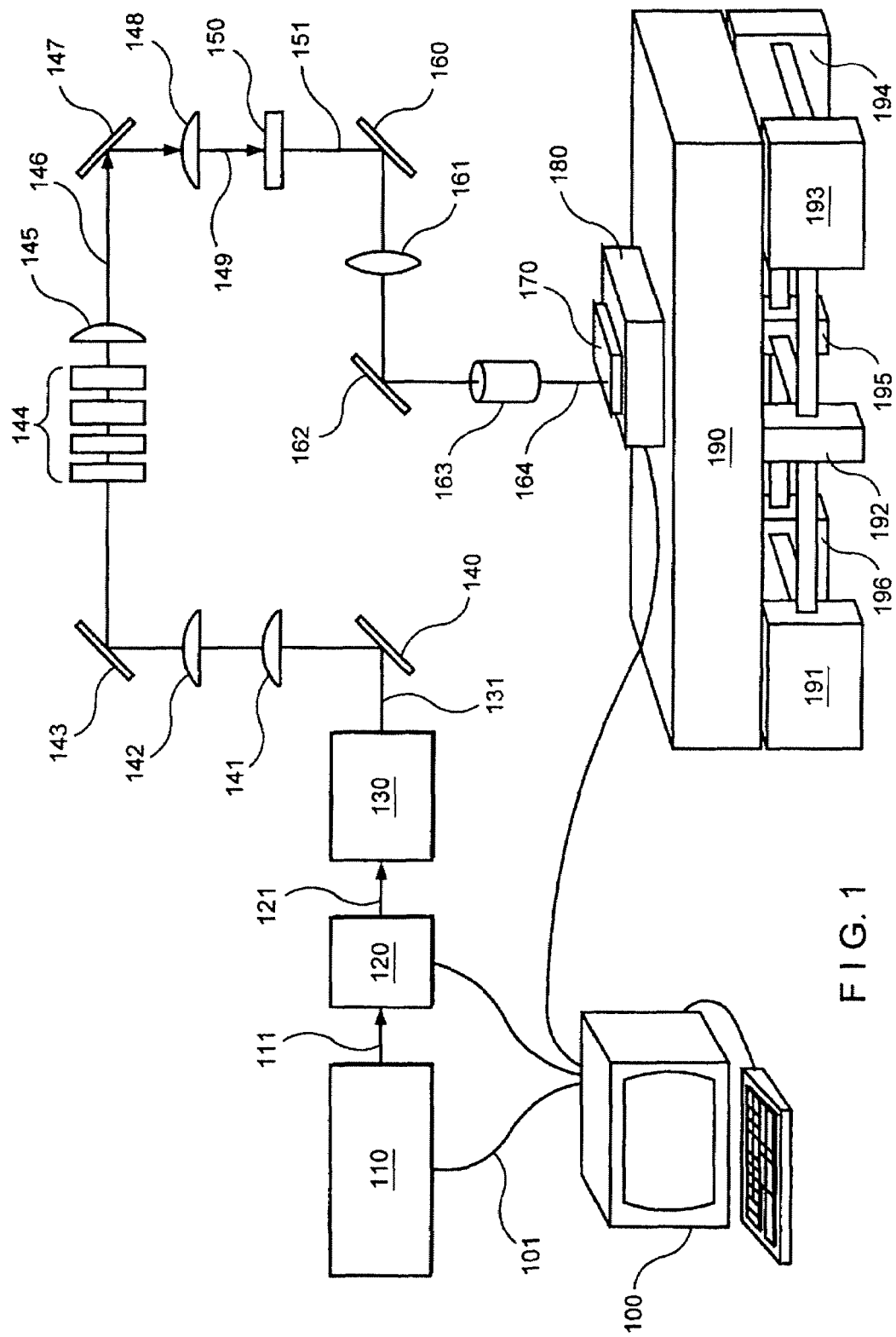
FIG. 1 is a functional diagram of a system for performing the lateral solidification process preferred to implement a preferred process of the present invention.

With reference to FIG. 1, our co-pending patent application describes as a preferred embodiment a system including excimer laser 110, energy density modulator 120 to rapidly change the energy density of laser beam 111, beam attenuator and shutter 130, optics 140, 141, 142 and 143, beam homogenizer 144, lens system 145, 146, 148, masking system 150, lens system 161, 162, 163, incident laser pulse 164, thin silicon film sample 170, sample translation stage 180, granite block 190, support system 191, 192, 193, 194, 195, 196, and managing computer 100 X and Y direction translation of the silicon sample 170 may be effected by either movement of a mask 210 within masking system 150 or by movement of the sample translation stage 180 under the direction of computer 100.

As described in further detail in our co-pending application, an amorphous silicon thin film sample is processed into a single or polycrystalline silicon thin film by generating a plurality of excimer laser pulses of a predetermined fluence, controllably modulating the fluence of the excimer laser pulses, homoginizing the modulated laser pulses in a predetermined plane, masking portions of the homoginized modulated laser pulses into patterned beamlets, irradiating an amorphous silicon thin film sample with the patterned beamlets to effect melting of portions thereof corresponding to the beamlets, and controllably translating the sample with respect to the patterned beamlets and with respect to the controlled modulation to thereby process the amorphous silicon thin film sample into a single or polycrystalline silicon thin film by sequential translation of the sample relative to the patterned beamlets and irradiation of the sample by patterned beamlets of varying fluence at corresponding sequential locations thereon. The following embodiments of the present invention will now be described with reference to the foregoing processing technique.

Figure 2A:
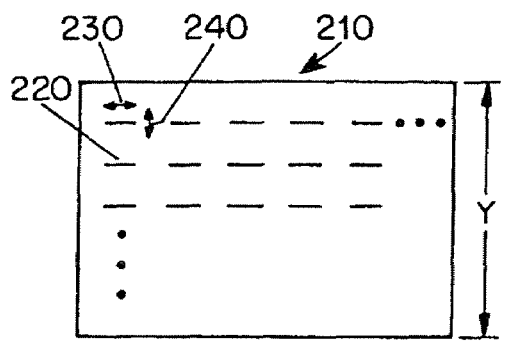
FIG. 2a is an illustrative diagram showing a mask having a dashed pattern.

Referring to FIGS. 2a and b, a first embodiment of the present invention will now be described. FIG. 2a illustrates a mask 210 incorporating a pattern of slits 220. The mask 210 is preferably fabricated from a quartz substrate, and includes either a metallic or dielectric coating which is etched by conventional techniques to form a mask pattern, such as that shown in FIG. 2a. Each slit 220 is of a breadth 230 which is chosen in accordance with the necessary dimensionality of the device that will be fabricated on the sample 170 in the particular location that corresponds to the slit 220. For example, the slits 220 should be approximately 25 micrometers across to fabricate a 25 micrometer semiconductor device, or in the case of a multi-part device, a channel in a device, in sample 170. The width 240 of the slit 220 is preferably between approximately two and five micrometers in order to be small enough to avoid nucleation in sample 170 and large enough to maximize lateral crystal growth for each excimer pulse. It should be understood that although FIG. 2a illustrates a regular pattern of slits 220, any pattern of slits could be utilized in accordance with the microstructures desired to be fabricated on film 170.

Figure 2B:
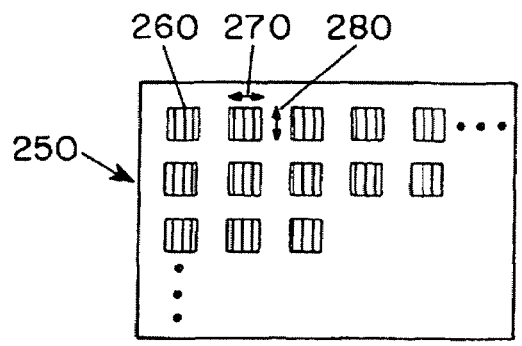
FIG. 2b is an illustrative diagram of a crystallized silicon film resulting from the use of the mask shown in FIG. 2a in the system of FIG. 1.

In accordance with the present invention, the sample 170 is translated with respect to the laser pulses 164, either by movement of masking system 150 or sample translation stage 180, in order to grow crystal regions in the sample 170. When the sample 170 is translated in the Y direction and mask 210 is used in masking system 150, a processed sample 250 having crystallized regions 260 is produced, as shown in FIG. 2b. The breadth 270 of each crystallized region will be approximately equal to the breadth 230 in the mask 210. The length 280 of each region will be approximately equal to the distance of Y translation effected by movement of the masking system 150 or translation stage 180, and as with the breadth, should be chosen in accordance with the final device characteristics. Each crystal region 260 will consist of polysilicon with long and directionally controlled grains.

Figure 3A:
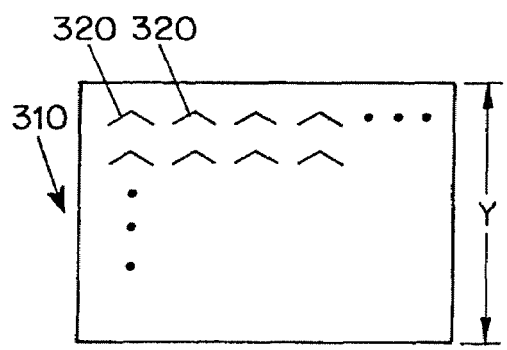
FIG. 3a is an illustrative diagram showing a mask having a chevron pattern.
Figure 3B:
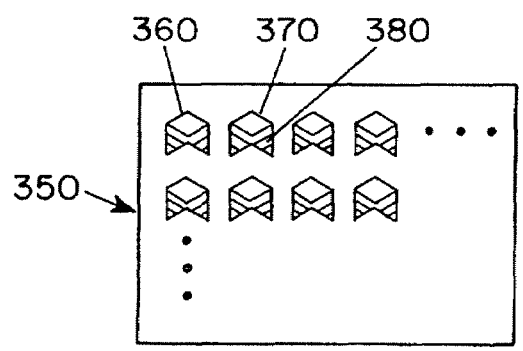
FIG. 3b is an illustrative diagram of a crystallized silicon film resulting from the use of the mask shown in FIG. 3a in the system of FIG. 1.

Referring next to FIGS. 3a and b, a second embodiment of the present invention will now be described. FIG. 3a illustrates a mask 310 incorporating a pattern of chevrons 320. The breadth 320 of each chevron side will determine the size of the ultimate single crystal region to be formed in sample 170. When the sample 170 is translated in the Y direction and mask 310 is used in masking system 150, a processed sample 350 having crystallized regions 360 is produced, as shown in FIG. 3b. Each crystal region 360 will consist of a diamond shaped single crystal region 370 and two long grained, directionally controlled polycrystalline silicon regions 380 in the tails of each chevron.

While the embodiments described with reference to FIGS. 2 and 3 are advantageous to generate spatially separated devices on silicon sample 170, at least some of the silicon sample 170 is not utilized in the final semiconductor. In order to facilitate a more flexible configuration of devices that can be developed on the semiconductor sample 170, the following preferred embodiments will now be described.

Figure 4A:
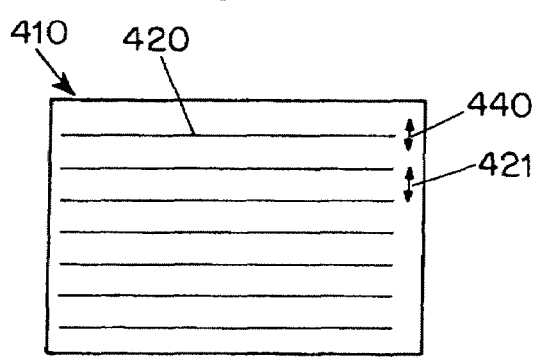
FIG. 4a is an illustrative diagram showing a mask having a line pattern.

Referring to FIGS. 4a and b, a third embodiment of the present invention will now be described. FIG. 4a illustrates a mask 410 incorporating a pattern of slits 420. Each slit 410 should extend as far across on the mask as the homogenized laser beam 149 incident on the mask permits, and must have a width 440 that is sufficiently narrow to prevent any nucleation from taking place in the irradiated region of sample 170. The width 440 will depend on a number of factors, including the energy density of the incident laser pulse, the duration of the incident laser pulse, the thickness of the silicon thin film sample, and the temperature and conductivity of the silicon substrate. For example, the slit should not be more than 2 micrometers wide when a 500 Angstrom film is to be irradiated at room temperature with a laser pulse of 30 ns and having an energy density that slightly exceeds the complete melt threshold of the sample.

Figure 4B:
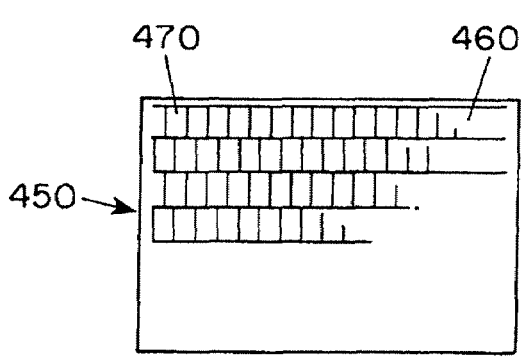
FIG. 4b is an illustrative diagram of a crystallized silicon film resulting from the use of the mask shown in FIG. 4a in the system of FIG. 1.

When the sample 170 is translated in the Y direction and mask 410 is used in masking system 150, a processed sample 450 having crystallized regions 460 is produced, as shown in FIG. 4b. Each crystal region 460 will consist of long grained, directionally controlled crystals 470. Depending on the periodicity 421 of the masking slits 420 in sample 410, the length of the grains 470 will be longer or shorter. In order to prevent amorphous silicon regions from being left on sample 170, the Y translation distance must be smaller than the distance 421 between mask lines, and it is preferred that the translation be at least one micron smaller than this distance 421 to eliminate small crystals that inevitably form at the initial stage of a directionally controlled polycrystalline structure.

Figure 5A:
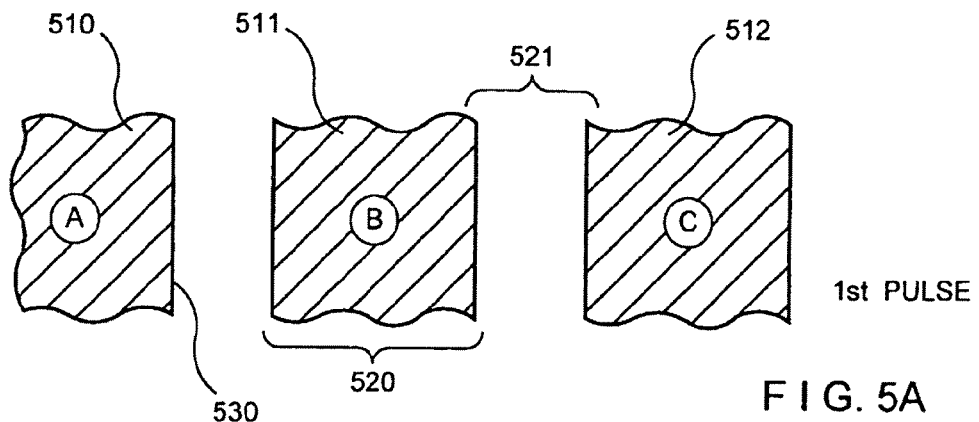
FIG. 5a is an illustrative diagram showing irradiated areas of a silicon sample using a mask having a line pattern.
Figure 5B:
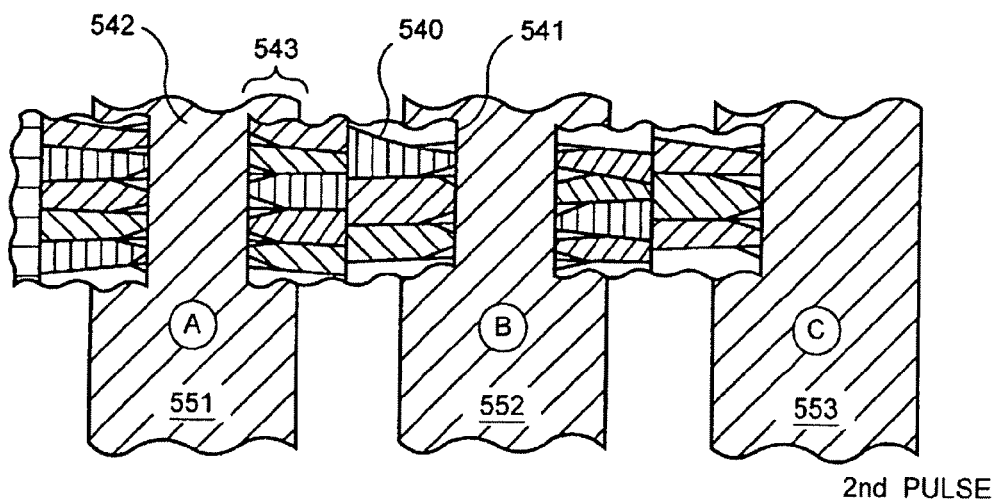
FIG. 5b is an illustrative diagram showing irradiated areas of a silicon sample using a mask having a line pattern after initial irradiation and sample translation has occurred.

An especially preferred technique using a mask having a pattern of lines will next be described. Using a mask as shown in FIG. 4a where closely packed mask lines 420 having a width 440 of 4 micrometers are each spaced 2 micrometers apart, the sample 170 is irradiated with one laser pulse. As shown in FIG. 5a, the laser pulse will melt regions 510, 511, 512 on the sample, where each melt region is approximately 4 micrometers wide 520 and is spaced approximately 2 micrometers apart 521. This first laser pulse will induce the formation of crystal growth in the irradiated regions 510, 511, 512, starting from the melt boundaries 530 and proceeding into the melt region, so that polycrystalline silicon 540 forms in the irradiated regions, as shown in FIG. 5b.

Figure 5C:
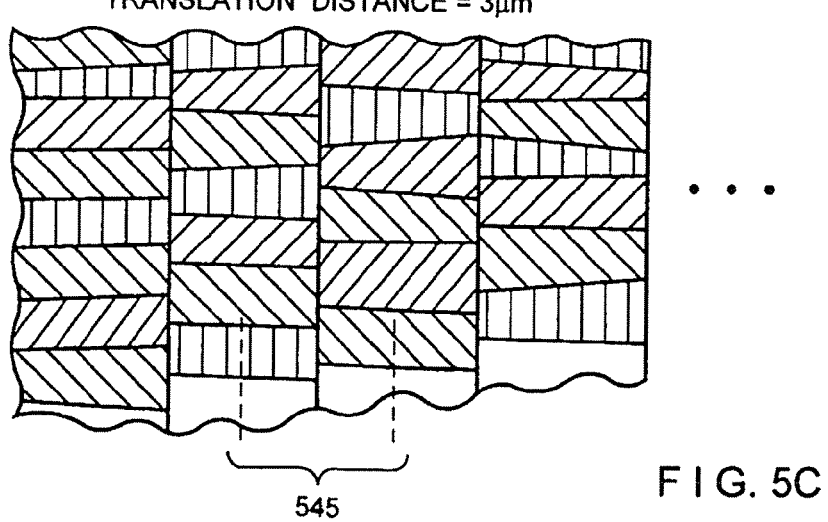
FIG. 5c is an illustrative diagram showing a crystallized silicon film after a second irradiation has occurred.

In order to eliminate the numerous small initial crystals 541 that form at the melt boundaries 530, the sample 170 is translated three micrometers in the Y direction and again irradiated with a single excimer laser pulse. The second irradiation regions 551, 552, 553 cause the remaining amorphous silicon 542 and initial crystal regions 543 of the polycrystalline silicon 540 to melt, while leaving the central section 545 of the polycrystalline silicon to remain. As shown in FIG. 5c, the crystal structure which forms the central section 545 outwardly grows upon solidification of melted regions 542, 542, so that a directionally controlled long grained polycrystalline silicon device is formed on sample 170.

Figure 6A:
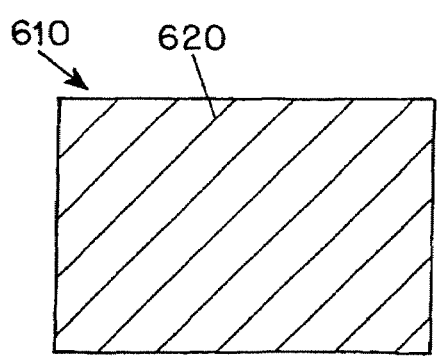
FIG. 6a is an illustrative diagram showing a mask having a diagonal line pattern.
Figure 6B:
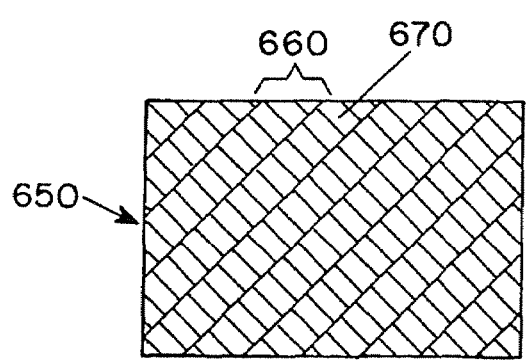
FIG. 6b is an illustrative diagram of a crystallized silicon film resulting from the use of the mask shown in FIG. 6a in the system of FIG. 1.

Referring to FIGS. 6a and b, a fourth embodiment of the present invention will now be described. FIG. 6a illustrates a mask 610 incorporating a pattern of diagonal lines 620. When the sample 170 is translated in the Y direction and mask 610 is used in masking system 150, a processed sample 650 having crystallized regions 660 is produced, as shown in FIG. 6b. Each crystal region 660 will consist of long grained, directionally controlled crystals 670.

As with the embodiment described above with respect to FIGS. 4a and b, the translation distance will depend on the desired crystal length. Also, the process described with reference to FIGS. 5a-c could readily be employed using a mask as shown in FIG. 6a, having 4 micrometer wide lines 620 that are each spaced apart by 2 micrometers. This embodiment is especially advantageous in the fabrication of displays or other devices that are oriented with respect to an XY axis, as the polycrystalline structure is not orthogonal to that axis and accordingly, the device performance will be independent of the X or Y coordinates.

Figure 7A:
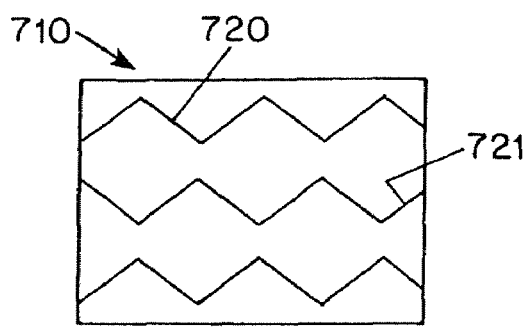
FIG. 7a is an illustrative diagram showing a mask having a sawtooth pattern.
Figure 7B:
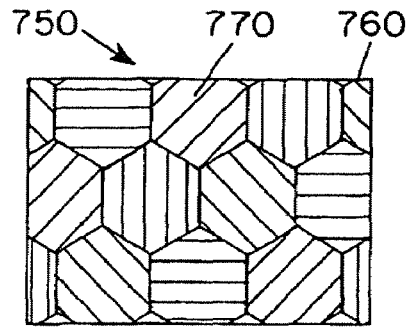
FIG. 7b is an illustrative diagram of a crystallized silicon film resulting from the use of the mask shown in FIG. 7a in the system of FIG. 1.

Referring next to FIGS. 7a and b, a fifth embodiment of the present invention will now be described. FIG. 7a illustrates a mask 710 incorporating offset sawtooth wave patterns 720, 721. When the sample 170 is translated in the Y direction and mask 710 is used in masking system 150, a processed sample 750 having crystallized regions 760 is produced, as shown in FIG. 7b. Each crystal region 760 will consist of a row of hexagonal-rectangular crystals 770. If the translation distance is slightly greater than the periodicity of the sawtooth pattern, the crystals will be hexagons. This embodiment is beneficial in the generation of larger silicon grains and may increase device performance.

Figure 8A:
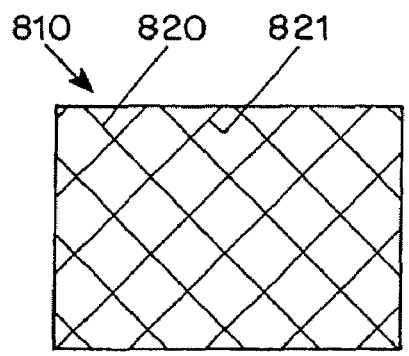
FIG. 8a is an illustrative diagram showing a mask having a crossing diagonal line pattern.
Figure 8B:
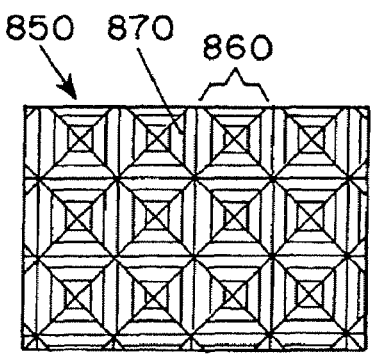
FIG. 8b is an illustrative diagram of a crystallized silicon film resulting from the use of the mask shown in FIG. 8a in the system of FIG. 1.

Referring next to FIGS. 8a and b, a sixth embodiment of the present invention will now be described. FIG. 8a illustrates a mask 810 incorporating a diagonal cross pattern 821, 822. When the sample 170 is translated in the Y direction and mask 810 is used in masking system 150, a processed sample 850 having crystallized regions 860 is produced, as shown in FIG. 8b. Each crystal region 860 will consist of a row of diamond shaped crystals 870. If the translation distance is slightly greater than the periodicity of the pattern, the crystals will be squares. This embodiment is also beneficial in the generation of larger silicon grains and may increase device performance.

Figure 9A:
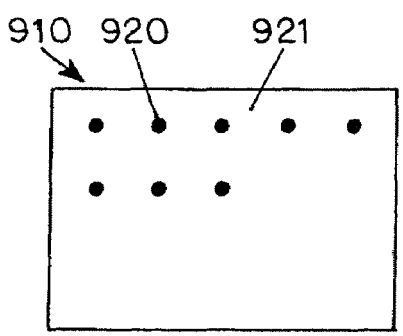
FIG. 9a is an illustrative diagram showing a mask having a polka-dot pattern.
Figure 9B:
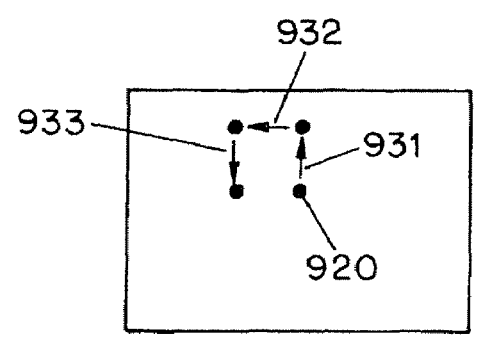
Figure 9C:
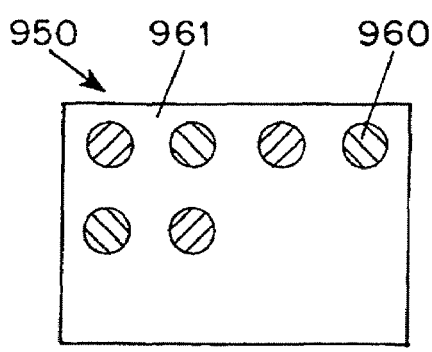
FIG. 9c is an illustrative diagram of a crystallized silicon film resulting from the use of the mask shown in FIG. 9a in the system of FIG. 1 using the mask translation scheme shown in FIG. 9b.
Figure 9D:
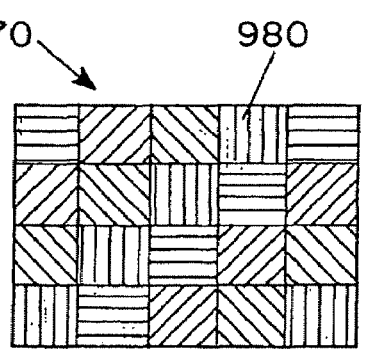
FIG. 9d is an illustrative diagram of an alternative crystallized silicon film resulting from the use of the mask shown in FIG. 9a in the system of FIG. 1 using the mask translation scheme shown in FIG. 9b.

Referring next to FIGS. 9a-d, a seventh embodiment of the present invention will now be described. FIG. 9a illustrates a mask 910 incorporating a polka-dot pattern 920. The polka-dot mask 910 is an inverted mask, where the polka-dots 920 correspond to masked regions and the remainder of the mask 921 is transparent. In order to fabricate large silicon crystals, the polka-dot pattern may be sequentially translated about the points on the sample 170 where such crystals are desired. For example, as shown in FIG. 9b, the polka-dot mask may be translated 931 a short distance in the positive Y direction after a first laser pulse, a short distance in the positive X direction 932 after a second laser pulse, and a short distance in the negative Y direction 933 after a third laser pulse to induce the formation of large crystals. If the separation distance between polka-dots is greater than two times the lateral growth distance, a crystalline structure 950 where crystals 960 separated by small grained polycrystalline silicon regions 961 is generated, as shown in FIG. 9c. If the separation distance is less or equal to two times the lateral growth distance so as to avoid nucleation, a crystalline structure 970 where crystals 980 are generated, as shown in FIG. 9d.

Figure 10:
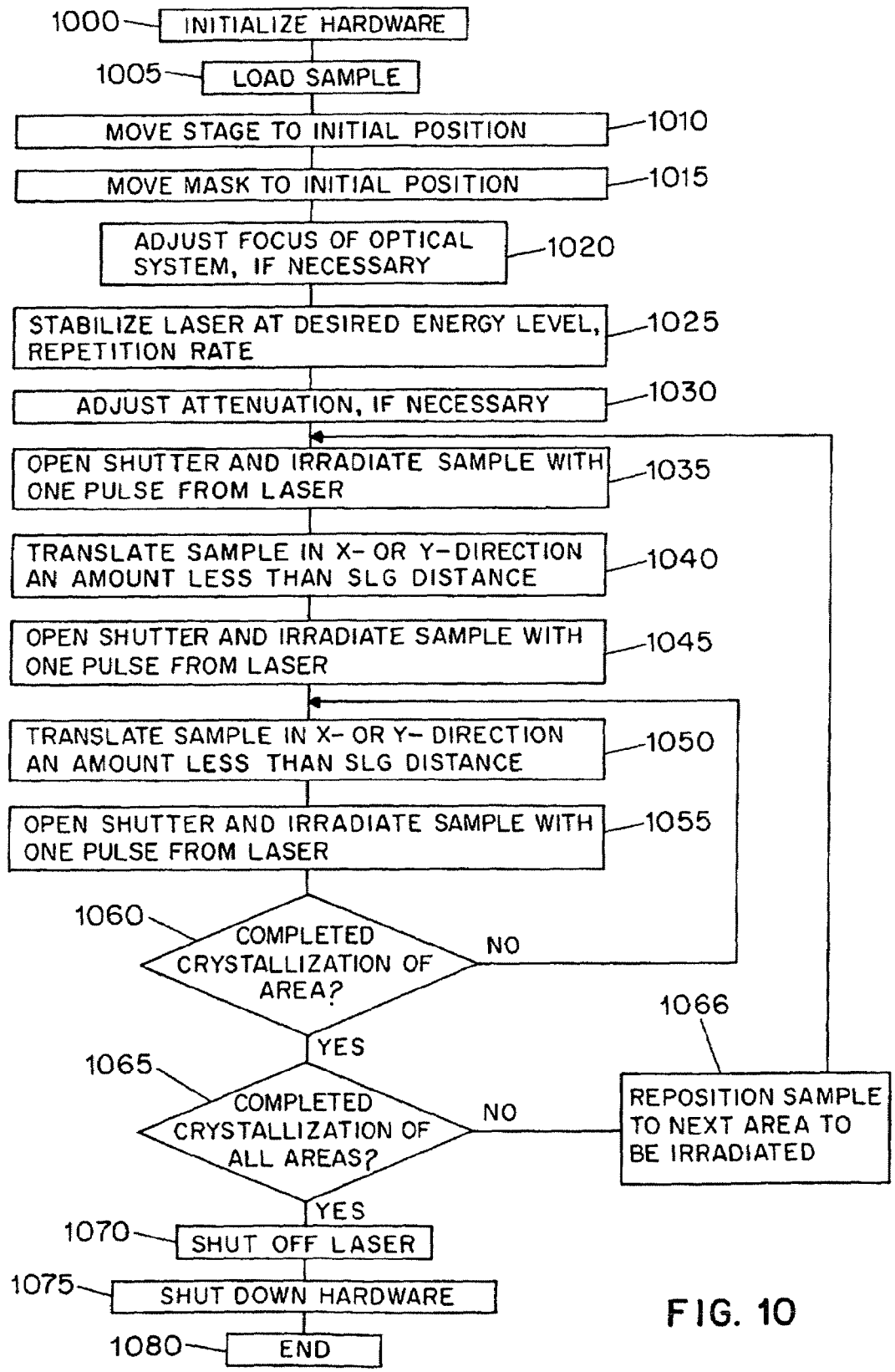
FIG. 10 is a flow diagram illustrating the steps implemented in the system of FIG. 1.

Referring next to FIG. 10, the steps executed by computer 100 to control the crystal growth process implemented with respect to FIG. 9 will be described. FIG. 10 is a flow diagram illustrating the basic steps implemented in the system of FIG. 1. The various electronics of the system shown in FIG. 1 are initialized 1000 by the computer to initiate the process. A thin silicon film sample is then loaded onto the sample translation stage 1005. It should be noted that such loading may be either manual or robotically implemented under the control of computer 100. Next, the sample translation stage is moved into an initial position 1015, which may include an alignment with respect to reference features on the sample. The various optical components of the system are focused 1020 if necessary. The laser is then stabilized 1025 to a desired energy level and reputation rate, as needed to fully melt the silicon sample in accordance with the particular processing to be carried out. If necessary, the attenuation of the laser pulses is finely adjusted 1030.

Next, the shutter is opened 1035 to expose the sample to a single pulse of irradiation and accordingly, to commence the sequential lateral solidification process. The sample is translated in the X or Y directions 1040 in an amount less than the super lateral grown distance. The shutter is again opened 1045 to expose the sample to a single pulse of irradiation, and the sample is again translated in the X or Y directions 1050 in an amount less than the super lateral growth distance. Of course, if the sample was moved in the X direction in step 1040, the sample should be moved in the Y direction in Step 1050 in order to create a polka-dot. The sample is then irradiated with a third laser pulse 1055. The process of sample translation and irradiation 1050, 1055 may be repeated 1060 to grow the polka-dot region with four or more laser pulses.

Next, if other areas on the sample have been designated for crystallization, the sample is repositioned 1065, 1066 and the crystallization process is repeated on the new area. If no further areas have been designated for crystallization, the laser is shut off 1070, the hardware is shut down 1075, and the process is completed 1080. Of course, if processing of additional samples is desired or if the present invention is utilized for batch processing, steps 1005, 1010, and 1035-1065 can be repeated on each sample.

The foregoing merely illustrates the principles of the invention. Various modifications and alterations to the described embodiments will be apparent to those skilled in the art in view of the teachings herein. For example, the thin silicon film sample 170 could be replaced by a sample having pre-patterned islands of silicon film. Also, the line pattern mask could be used to grow polycrystalline silicon using two laser pulses as explained with reference to FIGS. 5*a-c*, rotated by 90 degrees and used again in the same process to generate an array of square shaped single crystal silicon. It will thus be appreciated that those skilled in the art will be able to devise numerous systems and methods which, although not explicitly shown or described herein, embody the principles of the invention and are thus within the spirit and scope of the invention.

We claim:

1. A system for processing a silicon thin film into a polycrystalline silicon thin film, comprising:
    (a) an excimer laser for generating a plurality of excimer laser pulses of a predetermined fluence,
    (b) an energy density modulator, optically coupled to said excimer laser, for controllably modulating said fluence of said excimer laser pulses emitted by said excimer laser;
    (c) a beam homogenizer, optically coupled to said energy density modulator, for homogenizing said modulated laser pulses in a predetermined plane, said homogenized laser pulses each having a substantially predetermined size;
    (d) a mask having one or more slits having a predetermined width, optically coupled to said beam homogenizer, for masking each said homogenized modulated laser pulse to generate one or more laser beamlets corresponding to each homogenized laser pulse, such that each beamlet has a shape defined by a length corresponding to the predetermined laser pulse size and a width corresponding to the slit width;
    (e) a sample stage, optically coupled to said mask and adapted for translation, for receiving the one or more laser beamlets for each laser pulse to effect melting of a portion of any silicon thin film placed thereon corresponding to the shape of said laser beamlet; and
    (f) a computer, coupled to said excimer laser and said energy density modulator, for controlling said controllable fluence modulation of said excimer laser pulses and relative positions of said sample stage and said mask, and for coordinating said excimer pulse generation and said fluence modulation with said relative positions of said sample stage and said mask, to thereby process said silicon thin film into a polycrystalline silicon thin film by sequential translation of said sample stage relative to said mask and irradiation of said thin film by one or more laser beamlets for each laser pulse at corresponding sequential locations thereon.

2. The system according to claim 1, wherein the mask is adapted for translation.

3. The system according to claim 1, wherein the system comprises instructions executable by a computer for:
    (g) irradiating a silicon thin film with the laser beamlet to effect melting of a first portion of the thin film corresponding to the shape of the predefined slit pattern in the mask; and
    (h) based on dimensions of the mask, translating at least one of the thin film and the excimer laser pulses relative to the other one of the thin film and the excimer laser pulse so as to reach a second location.

4. A system for processing a silicon thin film into a polycrystalline silicon thin film, comprising:
    (a) a pulsed excimer laser for generating a plurality of excimer laser pulses; each having a
    substantially predetermined size;
    (b) a mask having one or more slits having a predetermined width, optically coupled to said pulsed excimer laser pulses, for masking each said laser pulse to generate one or more laser beamlets corresponding to each laser pulse, such that each beamlet has a shape defined by a length corresponding to the predetermined laser pulse size and a width corresponding to the slit width;
    (c) a sample stage, optically coupled to said mask and adapted for translation, for receiving the one or more laser beamlets for each laser pulse to effect melting of a portion of any silicon thin film placed thereon corresponding to the shape of said laser beamlet;
    (d) a computer, coupled to said excimer laser and said sample stage, for controlling said excimer laser pulses and relative positions of said sample stage and said mask, and for coordinating said excimer pulse generation with said relative positions of said sample stage and said mask; and
    (e) instructions on a computer readable medium to thereby process said silicon thin film into a polycrystalline silicon thin film by sequential translation of said sample stage relative to said mask and irradiation of said thin film by one or more laser beamlets for each laser pulse at corresponding sequential locations thereon, wherein each of the irradiated portions is melted through a thickness of the thin film and a lateral growth is effectuated in each molten portion of the thin film.

5. The system according to claim 4, wherein the mask is adapted for translation.

6. The system according to claim 4, wherein the system comprises instructions executable by a computer for:
    (g) irradiating a silicon thin film with the laser beamlet to effect melting of a first portion of the thin film corresponding to the shape of the predefined slit pattern in the mask; and
    (h) based on dimensions of the mask, translating at least one of the thin film and the excimer laser pulses relative to the other one of the thin film and the excimer laser pulse so as to reach a second loation.

* * * * *